United States Patent
Matsuoka et al.

(10) Patent No.: US 7,289,776 B2
(45) Date of Patent: Oct. 30, 2007

(54) NONLINEAR DISTORTION COMPENSATION CIRCUIT WITH FEEDBACK AND BASEBAND REFERENCE SIGNAL THAT ARE PHASE AND AMPLITUDE CONTROLLABLE

(75) Inventors: Akihiko Matsuoka, Yokohama (JP); Shinichiro Takabayashi, Yokosuka (JP); Yutaka Murakami, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 252 days.

(21) Appl. No.: 10/518,185

(22) PCT Filed: Sep. 29, 2003

(86) PCT No.: PCT/JP03/12403

§ 371 (c)(1),
(2), (4) Date: Dec. 16, 2004

(87) PCT Pub. No.: WO2004/032441

PCT Pub. Date: Apr. 15, 2004

(65) Prior Publication Data
US 2005/0245211 A1 Nov. 3, 2005

(30) Foreign Application Priority Data
Oct. 1, 2002 (JP) ............................ 2002-288599

(51) Int. Cl.
*H01Q 11/12* (2006.01)
(52) U.S. Cl. .................. 455/126; 455/63.1; 455/114.2; 455/114.3; 375/295; 375/296; 375/297; 375/285; 330/149

(58) Field of Classification Search ............... 455/63.1, 455/126, 114.2, 114.3, 126.1; 375/296, 297, 375/295, 285; 330/149
See application file for complete search history.

(56) References Cited

U.S. PATENT DOCUMENTS
6,091,941 A * 7/2000 Moriyama et al. .......... 455/126
(Continued)

FOREIGN PATENT DOCUMENTS
JP 06-037831 A 2/1994
(Continued)

OTHER PUBLICATIONS
International Search Report for application No. PCT/JP03/12403 dated Dec. 9, 2003.

*Primary Examiner*—Nay Maung
*Assistant Examiner*—Junpeng Chen
(74) *Attorney, Agent, or Firm*—RatnerPrestia

(57) ABSTRACT

A phase/amplitude control section controls the phase and amplitude of at least one of the signals: a distributed signal distributed by a modulation signal distributor and a reference signal based on an orthogonal base-band signal. A signal combiner combines a combinatory signal according to the distributed signal and the reference signal whose phase and amplitude have been controlled. A reference table updating section updates non-linear distortion compensating data according to the combinatory signal subjected to A/D conversion and the orthogonal base-band signal. With this configuration, since a known signal component is removed from the combinatory signal, the change amount of the signal input to the A/D converter of a feedback system circuit is reduced and the A/D converter of the feedback system circuit need not have a wide dynamic range performance.

17 Claims, 10 Drawing Sheets

U.S. PATENT DOCUMENTS

| | | |
|---|---|---|
| 6,188,732 B1 * | 2/2001 | Rha .......................... 375/297 |
| 6,246,286 B1 * | 6/2001 | Persson ..................... 330/149 |
| 6,400,774 B1 * | 6/2002 | Matsuoka et al. .......... 375/295 |
| 6,418,173 B1 * | 7/2002 | Matsuoka et al. .......... 375/297 |
| 6,980,604 B2 * | 12/2005 | Kubo et al. ................. 375/296 |
| 7,012,969 B2 * | 3/2006 | Ode et al. ................... 375/296 |
| 7,200,367 B1 * | 4/2007 | Wright et al. ................ 455/91 |
| 2001/0005402 A1 * | 6/2001 | Nagatani et al. ............ 375/296 |
| 2001/0051504 A1 * | 12/2001 | Kubo et al. ................... 455/63 |
| 2002/0025790 A1 * | 2/2002 | Matsuoka ................... 455/126 |
| 2002/0064236 A1 * | 5/2002 | Matsuoka et al. .......... 375/296 |
| 2002/0079965 A1 * | 6/2002 | Maniwa et al. ............. 330/149 |
| 2002/0097811 A1 * | 7/2002 | Kubo et al. ................. 375/296 |

FOREIGN PATENT DOCUMENTS

| | | | |
|---|---|---|---|
| JP | 06037831 A | * | 2/1994 |
| JP | 2001-268144 A | | 9/2001 |
| JP | 2001-345718 A | | 12/2001 |
| JP | 2002-057733 A | | 2/2002 |
| JP | 2002057733 A | * | 2/2002 |
| JP | 2002-141754 A | | 5/2002 |

* cited by examiner

NONLINEAR DISTORTION COMPENSATION CIRCUIT WITH FEEDBACK AND BASEBAND REFERENCE SIGNAL THAT ARE PHASE AND AMPLITUDE CONTROLLABLE

THIS APPLICATION IS A U.S. NATIONAL PHASE APPLICATION OF PCT INTERNATIONAL APPLICATION PCT/JP2003/012403.

TECHNICAL FIELD

The present invention relates to a transmission devices to be used in a communication apparatus of a radio communication system adopting a digital modulation method, the transmission device compensates non-linear distortion created in an amplifier of a transmission system.

BACKGROUND ART

Mobile communication systems adopting a digital modulation method have been actively developed in recent years. Use of a more efficient amplifier in a transmission system in order to save power at radio terminals tends to invite more non-linear distortions, which should be thus compensated.

One of the methods of compensating the non-linear distortions uses a value of transmission base-band signal for referring to a distortion compensation table, thereby compensating non-linear distortions both in amplitude and phase. In this method, feedback of parts of transmission signals and update of the distortion compensation table allow the compensation to follow the changes in characteristics of the amplifier.

The foregoing instanced transmission device orthogonally demodulates a feedback signal, and a resultant signal undergoes an analog-digital (A/D) conversion to form a digital feedback signal, which is then compared with orthogonal-modulation signal to be transmitted, thereby updating the distortion compensation table. This transmission device is disclosed in Japanese Patent Non-Examined Application Publication No. H06-37831.

A conventional transmission device as discussed above feeds back a signal including an output modulation signal to be supplied outside and a non-linear distortion component created in transmission system circuits, so that an A/D converter of a feedback system circuit needs to have wide dynamic range performance.

DISCLOSURE OF INVENTION

The present invention aims to provide a transmission device having a function of compensating non-linear distortions, and yet, the A/D converter in the feedback system circuit needs not to have wide dynamic range performance.

The transmission device of the present invention comprises the following elements:
  a non-linear distortion compensating section,
  a first orthogonal modulator,
  a modulation signal distributor,
  a phase/amplitude control section,
  a signal combiner, and
  a reference table updating section.

The non-linear distortion compensating section uses non-linear distortion compensating data for compensating non-linear distortions, and compensates the non-linear distortions of orthogonal base-band signals digitally demodulated.

The first orthogonal modulator orthogonally modulates the orthogonal base-band signals undergone the non-linear distortion compensation. The modulation signal distributor distributes modulation signals amplified from the signals undergone the first orthogonal modulator. The phase and amplitude controller controls both of the phase and amplitude of at least one of the signals distributed by the modulation signal distributor and a reference signal based on the orthogonal base-band signal. The signal combiner forms combinatory signals based on the distributed signals and the reference signal at least one of which phase and amplitude are controlled by the phase/amplitude control section. The reference table updating section updates non-linear distortion compensating data based on the orthogonal base-band signal and the combinatory signals undergone the A/D conversion.

The foregoing structure allows eliminating a known signal component by combining the combinatory signal based on the signals distributed from the modulation signals and the reference signal. Thus a change amount of a signal fed into A/D converter of the feedback system circuit becomes smaller, so that the A/D converter need not a wide dynamic range.

BEST MODE FOR PRACTICING THE INVENTION

The inventor of the present invention finds the following fact, which leads the present invention: In a transmission device adopting a non-linear distortion compensating method which feeds back parts of a transmission signal, direct transform of the transmission signal into a feedback signal produces a great difference between a level of the transmission signal component and a level of unnecessary component to be eliminated. Thus an A/D converter of a feedback system circuit needs a wide dynamic range. However, if the transmission signal component is not fed back, the dynamic range required to the A/D converter can be narrowed.

In other words, the gist of the present invention is to combine a transmission signal and a reference signal, and eliminate the reference signal component from a feedback signal, so that an A/D converter of a feedback system circuit needs not to have wide dynamic range performance.

Exemplary embodiments of the present invention are demonstrated hereinafter with reference to the accompanying drawings.

Exemplary Embodiment 1

Figure 1:
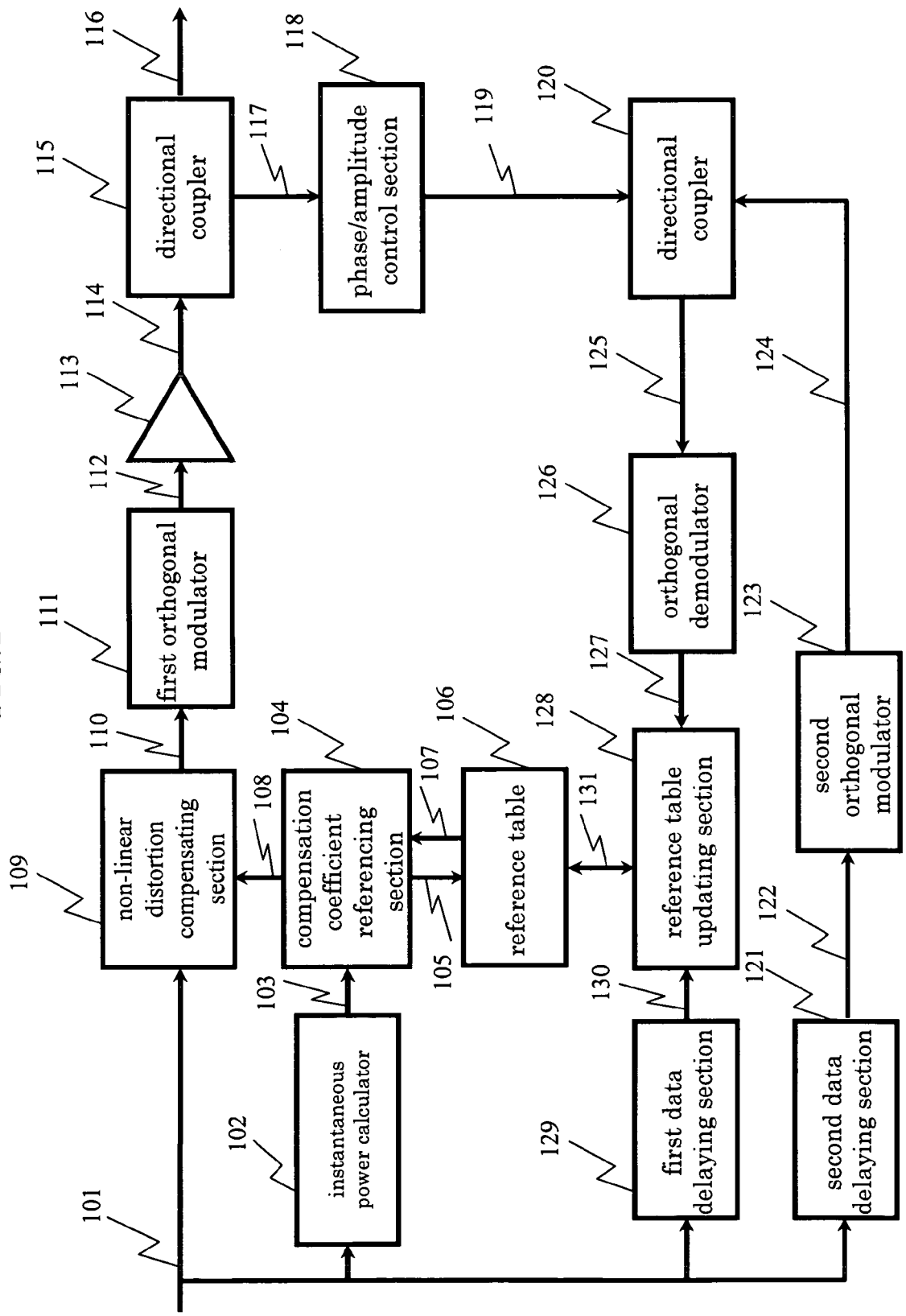
FIG. 1 shows a block diagram illustrating a structure of a transmission device specifically in accordance with a first exemplary embodiment of the present invention.

FIG. 1 shows a block diagram illustrating a structure of a transmission device in accordance with the first exemplary embodiment of the present invention. The transmission device shown in FIG. 1 comprises the following elements:

instantaneous power calculator 102 for calculating instantaneous power 103 of transmission digital orthogonal base-band signal 101;

compensation coefficient referencing section 104 for referencing to data for compensating non-linear distortions;

reference table 106 for outputting non-linear distortion compensating data 107 corresponding to reference address 105 shown by compensation coefficient referencing section 104;

non-linear distortion compensating section 109 for providing transmission digital orthogonal base-band signal 101 with non-linear distortion compensation by using orthogonal non-linear distortion compensating data 108 supplied from compensation coefficient referencing section 104;

first orthogonal modulator 111 for orthogonally modulating orthogonal base-band signal 110 undergone the non-linear distortion compensation;

power amplifier 113 for amplifying the power of modulation signal 112 undergone the orthogonal modulation;

directional coupler 115 for outputting amplified transmission modulation signal 114 as output modulation signal 116 as well as distributing parts of power as transmission modulation signal 117;

phase/amplitude control section 118 for controlling the phase and amplitude of transmission modulation signal 117;

directional coupler 120 for combining feedback signal 125 based on transmission modulation signal 119 whose phase and amplitude are controlled;

second data delaying section 121 for producing transmission digital orthogonal base-band signal 122 delayed from and based on transmission digital orthogonal base-band signal 101;

second orthogonal modulator 123 for orthogonally modulating delayed transmission digital orthogonal base-band signal 122, providing signal 122 with D/A conversion to produce reference modulation signal 124 which is a reference signal to the feedback signal;

orthogonal demodulator 126 for providing feedback signal 125 with A/D conversion before orthogonally demodulating signal 125;

reference signal updating section 128 for updating a reference table based on demodulated feedback digital orthogonal base-band signal 127; and first data delaying section 129 for producing delayed transmission digital orthogonal base-band signal 130 to be used for updating the reference table.

An operation of the transmission device having the foregoing structure is demonstrated hereinafter. Instantaneous power calculator 102 calculates an amount of instantaneous power of a transmission signal based on transmission digital orthogonal base-band signal 101. Compensation coefficient referencing section 104 produces reference address 105 based on the amount of the instantaneous power of the transmission signal, and refers to reference table 106 to be used for compensating non-linear distortions, thereby obtaining non-linear distortion compensating data 107 having reversal characteristics to those of non-linear distortion of the transmission system, and finally outputs orthogonal non-linear distortion compensating data.

Non-linear distortion compensating section 109 produces a complex product of base-band signal 101 and non-linear distortion compensating data 108, and outputs orthogonal base-band signal 110 undergone the non-linear distortion compensation. First orthogonal modulator 111 orthogonally modulates compensated base-band signal 110, then provides signal 110 with D/A conversion, and outputs analog modulated signal 112.

Power amplifier 113 amplifies analog modulated signal 112 up to a necessary value, and outputs transmission modulation signal 114. Directional coupler 115 outputs the most parts of signal 114 as output-transmission modulation signal 116, and distributes the rest as transmission modulation signal 117.

Phase/amplitude control section 118 controls the phase and amplitude of distributed transmission modulation signal 117 such that a desirable signal component of signal 117 has an amplitude equal to that of reference modulation signal 124 created in second orthogonal modulator 123 and has a phase different by 180° from that of signal 124. Then control section 118 outputs controlled signal 119.

Second data delaying section 121 delays transmission digital orthogonal base-band signal 101 by a predetermined amount. Second orthogonal modulator 123 orthogonally modulates digital transmission orthogonal base-band signal 122 delayed by second data delaying section 121, and provides signal 122 with D/A conversion to produce reference modulation signal 124.

Directional coupler 120 combines signal 119, whose phase and amplitude are controlled, with reference modulation signal 124, then outputs feedback signal 125. Orthogonal demodulator 126 provides feedback signal 125 with A/D conversion before orthogonally demodulating the signal 125, then outputs feedback digital orthogonal base-band signal 127.

First data delaying section 129 delays transmission digital orthogonal base-band signal 101 by a delayed time of the feedback system circuit, and outputs delayed transmission digital orthogonal base-band signal 130. Reference table updating section 128 updates reference table 106 with non-linear distortion compensating data 131 based on delayed transmission digital orthogonal base-band signal 130 and feedback digital orthogonal base-band signal 127.

As discussed above, this embodiment shows that the control of a feedback signal, i.e. the distributed transmission modulation signal, such that transmission modulation signal 119 and reference modulation signal 124 have an amplitude equal to each other and a phase difference in 180 degrees from each other, thereby removing a known component of the reference modulation signal. This preparation allows reducing a change amount of an input signal at A/D conversion in the feedback system circuit. As a result, the A/D converter of the feedback system circuit does not necessarily to have a wide dynamic range performance. Use of a reference table in this first embodiment allows compensating appropriately distortions created in a transmission system circuit, such as a power amplifier, having non-linear characteristics which is hard to express in a numerical formula.

Exemplary Embodiment 2

A transmission device in accordance with the second exemplary embodiment of the present invention obtains non-linear distortion compensating data not from reference table 106 but from calculation with computing equations prepared in compensation coefficient calculator 204. The coefficients of the computing equations are updated based on the feedback digital orthogonal base-band signal. The second embodiment is demonstrated hereinafter, but the descriptions of the same sections as those of the first embodiment are omitted, and the different sections from the first embodiment are focused.

Figure 2:
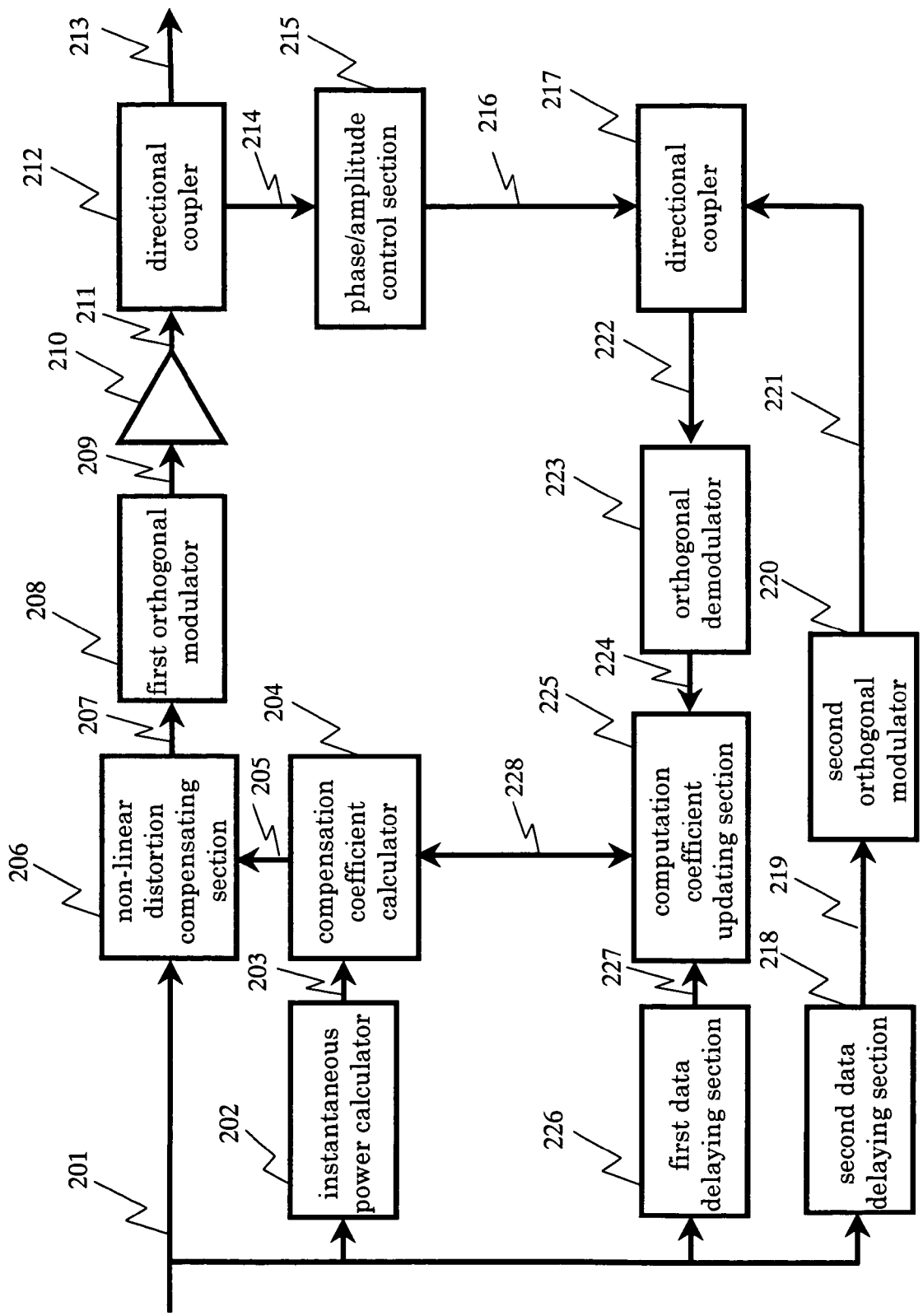
FIG. 2 shows a block diagram illustrating a structure of a transmission device specifically in accordance with a second exemplary embodiment of the present invention.

FIG. 2 shows a block diagram of the transmission device in accordance with the second embodiment. This transmission device comprises the following elements:
  instantaneous power calculator 202;
  compensation coefficient calculator 204 for calculating data to be used to compensate non-linear distortions;
  non-linear distortion compensating section 206;
  first orthogonal modulator 208;
  power amplifier 210;
  directional coupler 212;
  phase/amplifier control section 215;
  directional coupler 217;
  second orthogonal modulator 220;
  orthogonal demodulator 223;
  computation coefficient updating section 225;
  first data delaying section 226; and
  second data delaying section 218.

An operation of the transmission device as structured above is demonstrated hereinafter. Instantaneous power calculator 202 calculates a magnitude of transmission signal 203 based on transmission digital orthogonal base-band signal 201. Compensation coefficient calculator 204 calculates orthogonal non-linear distortion compensating data 205 by a predetermined computing equation based on the magnitude of transmission signal 203.

Non-linear distortion compensating section 206 produces a complex product of base-band signal 201 and non-linear distortion compensating data 205, and outputs orthogonal base-band signal 207 undergone the non-linear distortion compensation. First orthogonal modulator 208 orthogonally modulates compensated base-band signal 207, then provides signal 207 with D/A conversion, and outputs analog modulated signal 209.

Power amplifier 210 amplifies analog modulated signal 209 up to a necessary value, and outputs transmission modulation signal 211. Directional coupler 212 outputs the most parts of signal 211 as output-transmission modulation signal 213, and distributes the rest as transmission modulation signal 214. Phase/amplitude control section 215 controls the phase and amplitude of distributed transmission modulation signal 214 such that a desirable signal component of signal 214 has an amplitude equal to that of reference modulation signal 221 created in second orthogonal modulator 220 and has a phase different by 180° from that of signal 221. Then control section 215 outputs controlled signal 216.

Second data delaying section 218 delays transmission digital orthogonal base-band signal 201 by a predetermined amount. Second orthogonal modulator 220 orthogonally modulates digital transmission orthogonal base-band signal 219 delayed by second data delaying section 218, and provides signal 219 with D/A conversion to produce reference modulation signal 221. Directional coupler 217 combines signal 216, whose phase and amplitude are controlled, with reference modulation signal 221, then outputs feedback signal 222.

Orthogonal demodulator 223 provides feedback signal 222 with A/D conversion before orthogonally demodulating the signal 222, then outputs feedback digital orthogonal base-band signal 224.

First data delaying section 226 delays transmission digital orthogonal base-band signal 201 by a delayed time of the feedback system circuit, and outputs delayed transmission digital orthogonal base-band signal 227. Computation coefficient updating section 225 updates coefficient 228 of the computing equation, by which compensation coefficient calculator 204 calculates the non-linear distortion compensating data, based on delayed transmission digital orthogonal base-band signal 227 and feedback digital orthogonal base-band signal 224.

As discussed above, this embodiment shows that the control of a feedback signal, transmission modulation signal, such that transmission modulation signal 216 and reference modulation signal 221 have an amplitude equal to each other and a phase difference in 180 degrees from each other. Then coupler 217 removes a known component of reference modulation signal 221. This preparation allows reducing a change amount of an input signal at A/D conversion in the feedback system circuit. As a result, the A/D converter of the feedback system circuit does not necessarily to have wide dynamic range performance.

Use of an approximate equation to express non-linear characteristics in this second embodiment allows obtaining non-linear distortion compensating data with a little amount of memory, and thereby compensating appropriately distortions created in a transmission system circuit, such as a power amplifier.

In the foregoing demonstration, the non-linear distortion compensating data is found by a computing equation; however, the data is not limited to a specific one as long as the data can be found by processing digital signals. For instance, the coefficient can be changed by combining computing equations based on a fixed reference table.

An instantaneous power of the transmission digital orthogonal base-band signal is used as an input for finding the non-linear distortion compensating data; however, the present invention is not limited to this input. For instance, an instantaneous amplitude of the foregoing signal or the square of an instantaneous power of the same signal can be used.

Exemplary Embodiment 3

The transmission device in accordance with the third exemplary embodiment of the present invention changes an input of a phase/amplitude controller sourcing from an output supplied from second orthogonal modulator 321 instead of sourcing from an output supplied from directional coupler 115. The third embodiment is demonstrated hereinafter, but the descriptions of the same sections as those of the first embodiment are omitted, and the different sections from the first embodiment are focused.

Figure 3:
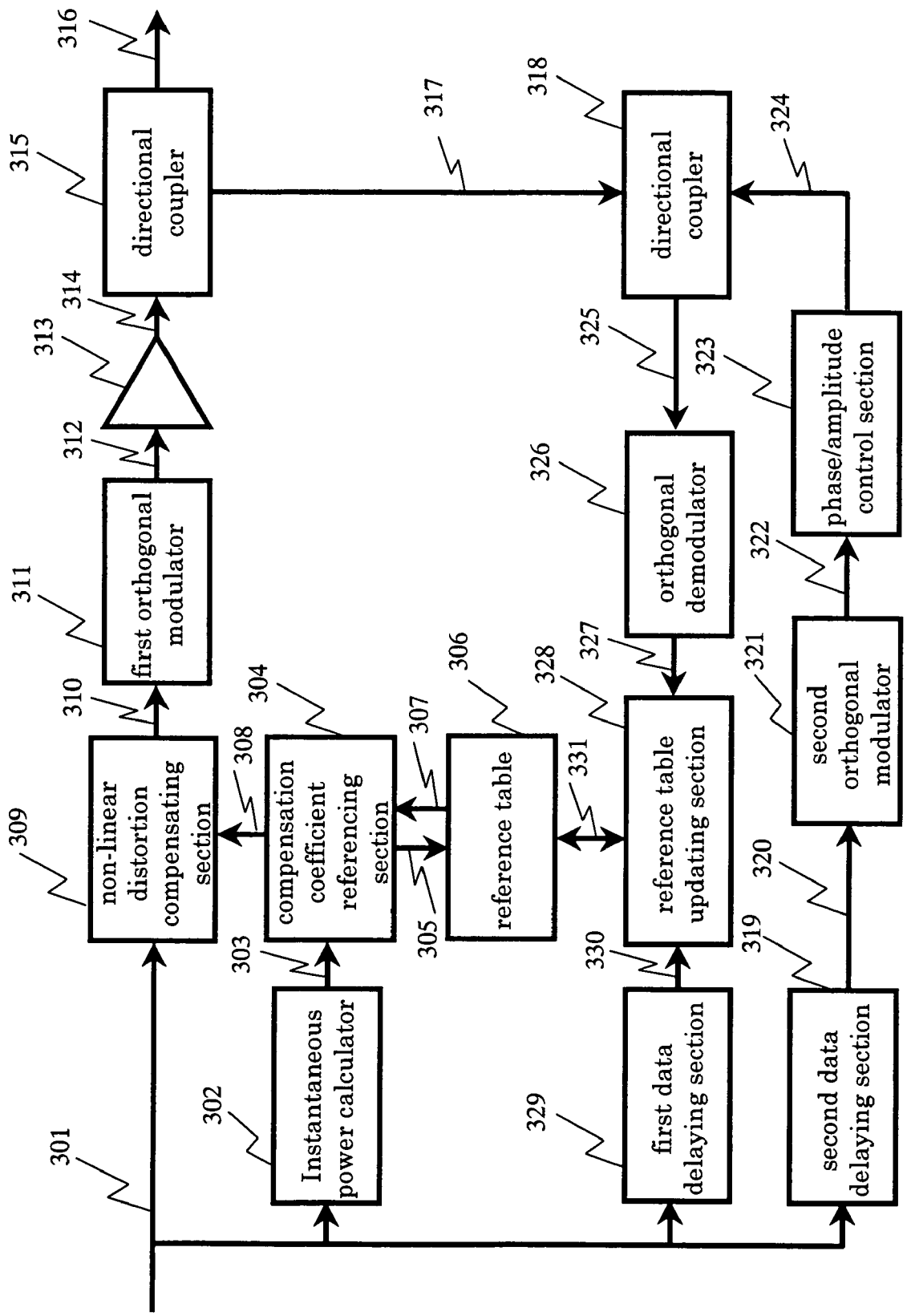
FIG. 3 shows a block diagram illustrating a structure of a transmission device specifically in accordance with a third exemplary embodiment of the present invention.

FIG. 3 shows a block diagram illustrating the transmission device in accordance with the third embodiment. This transmission device comprising the following elements:
- instantaneous power calculator 302;
- compensation coefficient referencing section 304;
- reference table 306;
- non-linear distortion compensating section 309;
- first orthogonal modulator 311;
- power amplifier 313;
- directional couplers 315, 318;
- second data delaying section 319;
- second orthogonal modulator 321;
- phase/amplifier control section 323;
- orthogonal demodulator 326;
- directional coupler 217;
- reference table updating section 328; and
- first data delaying section 329.

An operation of the transmission device as structured above is demonstrated hereinafter. Instantaneous power calculator 302 calculates a magnitude of transmission signal 303 based on transmission digital orthogonal base-band signal 301. Compensation coefficient referencing section 304 produces reference address 305 based on the magnitude of transmission signal 303, then refers to reference table 306 to be used for compensating non-linear distortion, thereby obtaining non-linear distortion compensating data 307 having characteristics reversal to the non-linear characteristics of the transmission system for outputting orthogonal non-linear distortion compensating data 308.

Non-linear distortion compensating section 309 produces a complex product of base-band signal 301 and orthogonal non-linear distortion compensating data 308, and outputs orthogonal base-band signal 310 undergone the non-linear distortion compensation. First orthogonal modulator 311 orthogonally modulates compensated base-band signal 310, then provides signal 310 with D/A conversion, and outputs analog modulated signal 312.

Power amplifier 313 amplifies analog modulated signal 312 up to a necessary value, and outputs transmission modulation signal 314. Directional coupler 315 outputs the most parts of signal 314 as output-transmission modulation signal 316, and distributes the rest as transmission modulation signal 317.

Second data delaying section 319 delays transmission digital orthogonal base-band signal 301 by a predetermined amount. Second orthogonal modulator 321 orthogonally modulates digital transmission orthogonal base-band signal 320 delayed by second data delaying section 319, and provides signal 320 with D/A conversion to produce reference modulation signal 322.

Phase/amplitude control section 323 controls the phase and amplitude of reference modulation signal 322 such that signal 322 has an amplitude equal to that of a desirable signal component of transmission modulation signal 317 and has a phase different by 180° from that of the desirable signal component of signal 317. Then control section 323 outputs controlled reference modulation signal 324. Directional coupler 318 combines signal 324, whose phase and amplitude are controlled, with transmission modulation signal 317, then outputs feedback signal 325.

Orthogonal demodulator 326 provides feedback signal 325 with A/D conversion before orthogonally demodulating the signal 325, then outputs feedback digital orthogonal base-band signal 327.

First data delaying section 329 delays transmission digital orthogonal base-band signal 301 by a delayed time of the feedback system circuit, and outputs delayed transmission digital orthogonal base-band signal 330. Reference table updating section 328 updates reference table 306 by non-linear distortion compensating data 331 based on delayed transmission digital orthogonal base-band signal 330 and feedback digital orthogonal base-band signal 327.

As discussed above, this embodiment shows that the control of a feedback signal, i.e. the distributed transmission modulation signal, such that transmission modulation signal 317 and reference modulation signal 324 have an amplitude equal to each other and a phase different from each other. Then coupler 318 removes a known component of reference modulation signal 324. This preparation allows reducing a change amount of an input signal at A/D conversion in the feedback system circuit. As a result, the A/D converter of the feedback system circuit does not necessarily to have a wide dynamic range performance.

Use of a reference table in this third embodiment allows compensating appropriately distortions created in a transmission system circuit, such as a power amplifier, having non-linear characteristics which is hard to express in a numerical formula.

Exemplary Embodiment 4

The transmission device in accordance with the fourth exemplary embodiment of the present invention changes an input of a phase/amplitude controller sourcing from an output supplied from second orthogonal modulator 418 instead of sourcing from an output supplied from directional coupler 212. The fourth embodiment is demonstrated hereinafter, but the descriptions of the same sections as those of the second embodiment are omitted, and the different sections from the second embodiment are focused.

Figure 4:
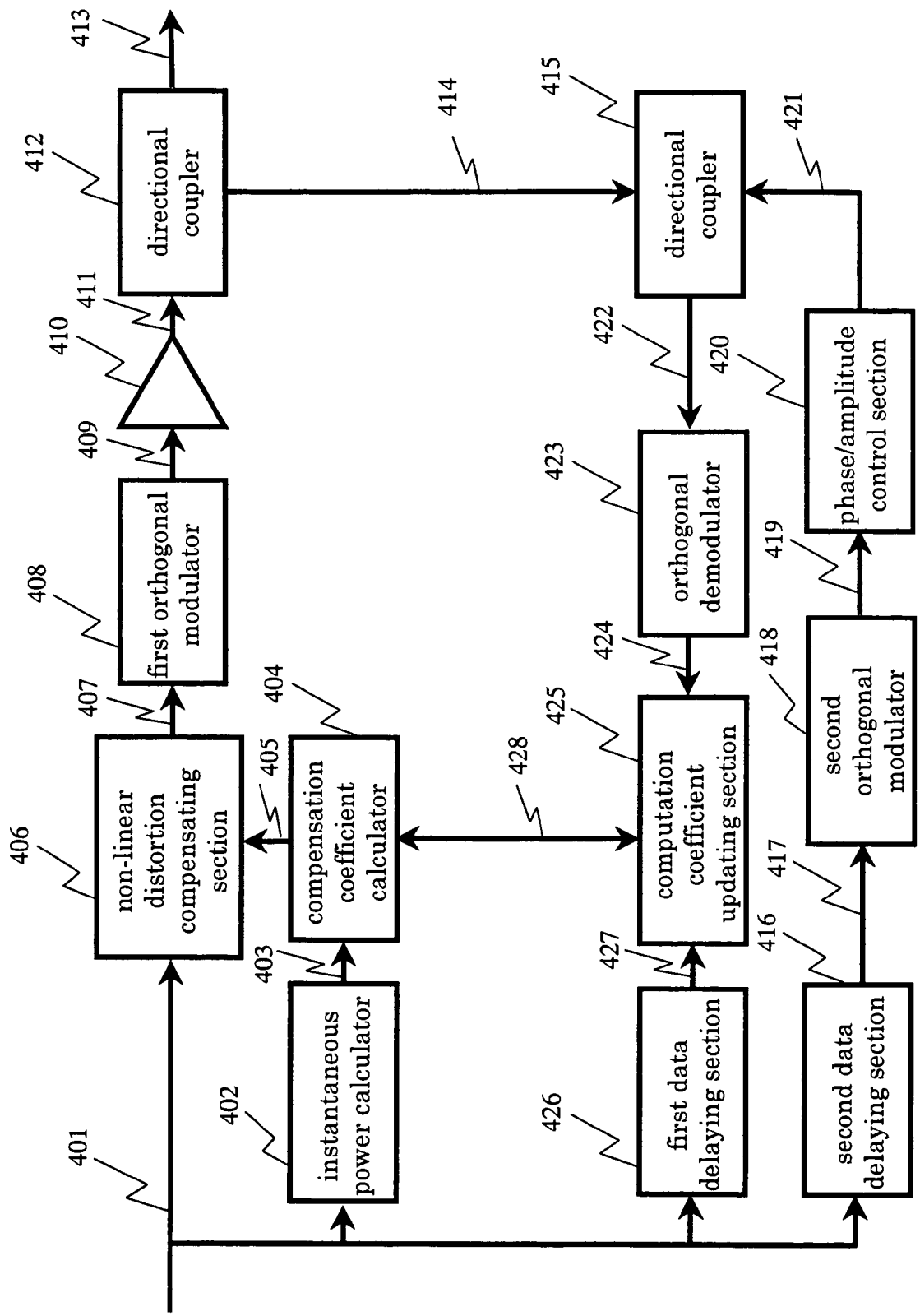
FIG. 4 shows a block diagram illustrating a structure of a transmission device specifically in accordance with a fourth exemplary embodiment of the present invention.

FIG. 4 shows a block diagram of the transmission device in accordance with the fourth embodiment. This transmission device comprises the following elements:
- instantaneous power calculator 402;
- compensation coefficient calculator 404;
- non-linear distortion compensating section 406;
- first orthogonal modulator 408;
- power amplifier 410;
- directional couplers 412, 415;
- second data delaying section 416;
- second orthogonal modulator 418;
- phase/amplifier control section 420;
- orthogonal demodulator 423;
- computation coefficient updating section 415; and
- first data delaying section 426.

An operation of the transmission device as structured above is demonstrated hereinafter. Instantaneous power calculator 402 calculates a magnitude of transmission signal 403 based on transmission digital orthogonal base-band signal 401. Compensation coefficient calculator 404 calculates orthogonal non-linear distortion compensating data 405 by a predetermined computing equation based on the magnitude of transmission signal 403.

Non-linear distortion compensating section 406 produces a complex product of transmission digital orthogonal base-band signal 401 and non-linear distortion compensating data 405, and outputs orthogonal base-band signal 407 undergone the non-linear distortion compensation. First orthogonal modulator 408 orthogonally modulates compensated base-band signal 407, then provides signal 407 with D/A conversion, and outputs analog modulated signal 409.

Power amplifier 410 amplifies analog modulated signal 409 up to a necessary value, and outputs transmission modulation signal 411. Directional coupler 412 outputs the most parts of signal 411 as output-transmission modulation signal 413, and distributes the rest as transmission modulation signal 414.

Second data delaying section 416 delays transmission digital orthogonal base-band signal 401 by a predetermined amount. Second orthogonal modulator 418 orthogonally modulates digital transmission orthogonal base-band signal 417 delayed by second data delaying section 416, and provides signal 417 with D/A conversion to produce reference modulation signal 419.

Phase/amplitude control section 420 controls the phase and amplitude of reference modulation signal 419 such that signal 419 has an amplitude equal to that of a desirable signal component of transmission modulation signal 414 and has a phase different by 180° from that of the desirable signal component of signal 414. Then control section 420 outputs controlled reference modulation signal 421. Directional coupler 415 combines signal 421, whose phase and amplitude are controlled, with transmission modulation signal 414, then outputs feedback signal 422. Orthogonal demodulator 423 provides feedback signal 422 with A/D conversion before orthogonally demodulating the signal 422, then outputs feedback digital orthogonal base-band signal 424.

First data delaying section 426 delays transmission digital orthogonal base-band signal 401 by a delayed time of the feedback system circuit, and outputs delayed transmission digital orthogonal base-band signal 427. Computation coefficient updating section 425 updates coefficient 428 of the computing equation, by which compensation coefficient calculator 404 calculates the non-linear distortion compensating data, based on delayed transmission digital orthogonal base-band signal 427 and feedback digital orthogonal base-band signal 424.

As discussed above, this embodiment shows that the control of a reference signal, i.e. the distributed transmission modulation signal, such that transmission modulation signal 414 and reference modulation signal 421 have an amplitude equal to each other and a phase difference in 180 degrees from each other. Then coupler 415 removes a known component of reference modulation signal 421. This preparation allows reducing a change amount of an input signal at A/D conversion in the feedback system circuit. As a result, the A/D converter of the feedback system circuit does not necessarily to have a wide dynamic range performance.

Use of an approximate equation to express non-linear characteristics in this fourth embodiment allows obtaining non-linear distortion compensating data with a little amount of memory, and thereby compensating appropriately distortions created in a transmission system circuit, such as a power amplifier.

In the foregoing demonstration, the non-linear distortion compensating data is found by a computing equation; however, the data is not limited to a specific one as long as the data can be found by processing digital signals. For instance, the coefficient can be changed by combining computing equations based on a fixed reference table.

An instantaneous power of the transmission digital orthogonal base-band signal is used as an input for finding the non-linear distortion compensating data; however, the present invention is not limited to this input. For instance, an instantaneous amplitude of the foregoing signal or the square of an instantaneous power of the same signal can be used.

Exemplary Embodiment 5

The transmission device in accordance with the fifth exemplary embodiment of the present invention adds digital adder 528 to an output section of orthogonal demodulator 526. The fifth embodiment is demonstrated hereinafter, but the descriptions of the same sections as those of the first embodiment are omitted, and an operation focused on the different sections from the first embodiment are detailed.

Figure 5:
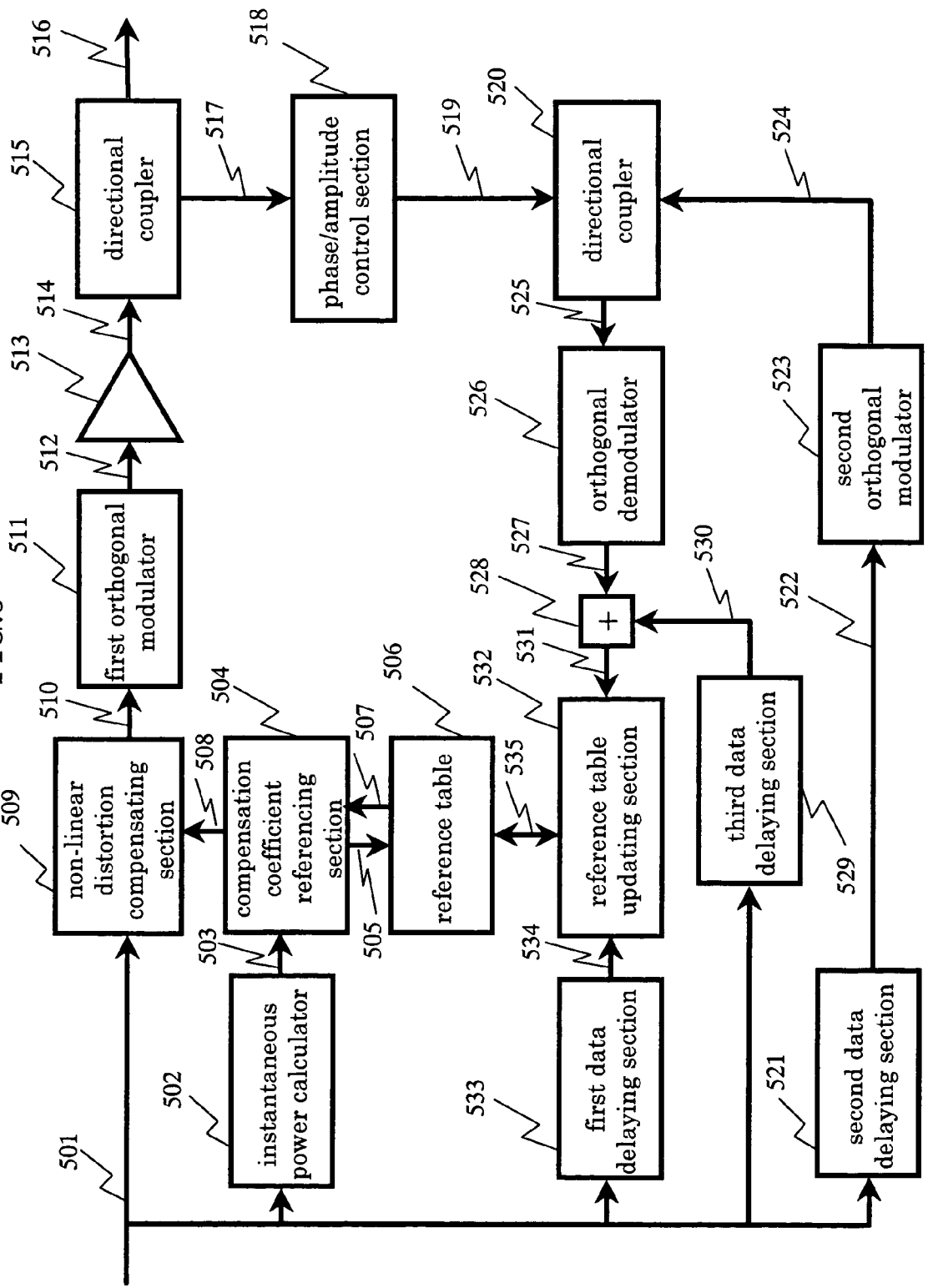
FIG. 5 shows a block diagram illustrating a structure of a transmission device specifically in accordance with a fifth exemplary embodiment of the present invention.

FIG. 5 shows a block diagram illustrating the transmission device in accordance with the fifth embodiment. This transmission device comprising the following elements:
  instantaneous power calculator 502;
  compensation coefficient referencing section 504;
  reference table 506;
  non-linear distortion compensating section 509;
  first orthogonal modulator 511;
  power amplifier 513;
  directional couplers 515;
  phase/amplifier control section 518;
  directional coupler 520;
  second data delaying section 521;
  second orthogonal modulator 523;
  orthogonal demodulator 526;
  digital adder 528;
  third data delaying section 529;
  reference table updating section 532; and
  first data delaying section 533.

An operation of the transmission device as structured above is demonstrated hereinafter. Instantaneous power calculator 502 calculates a magnitude of transmission signal 503 based on transmission digital orthogonal base-band signal 501. Compensation coefficient referencing section 504 produces reference address 505 based on the magnitude of transmission signal 503, then refers to reference table 506 to be used for compensating non-linear distortion, thereby obtaining non-linear distortion compensating data 507 having characteristics reversal to the non-linear characteristics of the transmission system. Then referencing section 504 outputs orthogonal non-linear distortion compensating data 508.

Non-linear distortion compensating section 509 produces a complex product of base-band signal 501 and orthogonal non-linear distortion compensating data 508, and outputs orthogonal base-band signal 510 undergone the non-linear distortion compensation. First orthogonal modulator 511 orthogonally modulates compensated base-band signal 510, then provides signal 510 with D/A conversion, and outputs analog modulated signal 512.

Power amplifier 513 amplifies analog modulated signal 512 up to a necessary value, and outputs transmission modulation signal 514. Directional coupler 515 outputs the most parts of signal 514 as output-transmission modulation signal 516, and distributes the rest as transmission modulation signal 517.

Phase/amplitude control section 518 controls the phase and amplitude of distributed transmission modulation signal 517 such that a desirable signal component of signal 517 has an amplitude equal to that of reference modulation signal 524 created in second orthogonal modulator 523 and has a phase different by 180° from that of signal 524. Then control section 518 outputs controlled signal 519.

Second data delaying section 521 delays transmission digital orthogonal base-band signal 501 by a predetermined amount. Second orthogonal modulator 523 orthogonally modulates digital transmission orthogonal base-band signal 522 delayed by second data delaying section 521, and provides signal 522 with D/A conversion to produce reference modulation signal 524.

Directional coupler 520 combines signal 519, whose phase and amplitude are controlled, with reference modulation signal 524, then outputs feedback signal 525. Orthogonal demodulator 526 provides feedback signal 525 with A/D conversion before orthogonally demodulating the signal 525, then outputs feedback digital orthogonal base-band signal 527.

Third data delaying section 529 outputs digital orthogonal base-band signal 530 formed by delaying signal 501 by a predetermined amount. Digital adder 528 adds signal 530 to feedback digital orthogonal base-band signal 527, and outputs the added feedback digital orthogonal base-band signal 531.

First data delaying section 533 delays transmission digital orthogonal base-band signal 501 by a delayed time of the feedback system circuit, and outputs delayed transmission digital orthogonal base-band signal 534. Reference table updating section 532 updates reference table 506 with non-linear distortion compensating data 535 based on the delayed transmission digital orthogonal base-band signal 534 and the added feedback digital orthogonal base-band signal 531.

As discussed above, this embodiment shows that the control of a feedback signal, i.e. the distributed transmission modulation signal, such that transmission modulation signal 519 and reference modulation signal 524 have an amplitude equal to each other and a phase difference in 180 degrees from each other. Then coupler 520 removes a known component of reference modulation signal 524. This preparation allows reducing a change amount of an input signal at A/D conversion in the feedback system circuit. As a result, the A/D converter of the feedback system circuit does not necessarily to have a wide dynamic range performance. Use of a reference table in this fifth embodiment allows compensating appropriately distortions created in a transmission system circuit, such as a power amplifier, having non-linear characteristics which is hard to express in a numerical formula.

Further in this embodiment, since the input signal to the reference table updating section includes a component of transmission digital orthogonal base-band signal, no changes are needed in an algorithm used in the reference table updating section of the conventional method. In the conventional method, parts of the transmission signal are fed back as a feedback signal, then the feedback signal is orthogonally demodulated and undergoes A/D conversion to become a digital feedback signal. The conventional method compares this feedback signal with an orthogonal modulation signal to be transmitted.

In the foregoing description, the phase/amplitude control section is disposed to the signal distributed from the transmission modulation signal; however, the control section can be disposed to the reference modulation signal instead.

Exemplary Embodiment 6

The transmission device in accordance with the sixth exemplary embodiment of the present invention adds digital adder 625 to an output section of orthogonal demodulator 623. The sixth embodiment is demonstrated hereinafter, but the descriptions of the same sections as those of the second embodiment are omitted, and an operation focused on the different sections from the second embodiment are detailed.

Figure 6:
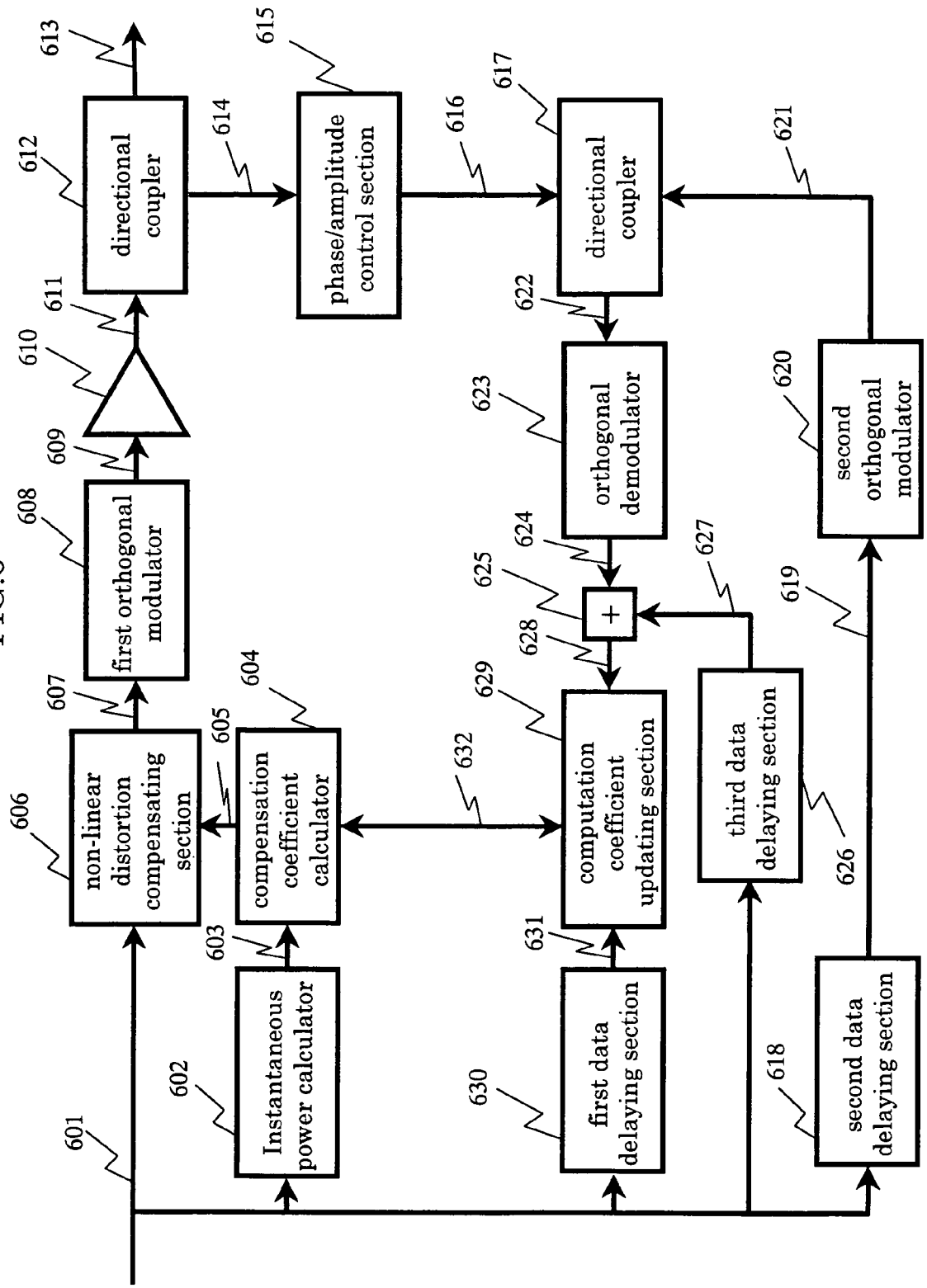
FIG. 6 shows a block diagram illustrating a structure of a transmission device specifically in accordance with a sixth exemplary embodiment of the present invention.

FIG. 6 shows a block diagram illustrating the transmission device in accordance with the sixth embodiment. This transmission device comprises the following elements:
  instantaneous power calculator 602;
  compensation coefficient calculator 604;
  non-linear distortion compensating section 606;
  first orthogonal modulator 608;
  power amplifier 610;
  directional couplers 612;
  phase/amplifier control section 615;
  directional coupler 617;
  second data delaying section 618;
  second orthogonal modulator 620;
  orthogonal demodulator 623;
  digital adder 625;
  third data delaying section 626;
  computation coefficient updating section 629; and
  first data delaying section 630.

An operation of the transmission device as structured above is demonstrated hereinafter. Instantaneous power calculator 602 calculates a magnitude of transmission signal 603 based on transmission digital orthogonal base-band signal 601. Compensation coefficient calculator 604 calculates orthogonal non-linear distortion compensating data 605 by a predetermined computing equation based on the magnitude of transmission signal 603.

Non-linear distortion compensating section 606 produces a complex product of transmission digital orthogonal base-band signal 601 and non-linear distortion compensating data 605, and outputs orthogonal base-band signal 607 undergone the non-linear distortion compensation. First orthogonal modulator 608 orthogonally modulates compensated base-band signal 607, then provides signal 607 with D/A conversion, and outputs analog modulated signal 609.

Power amplifier 610 amplifies analog modulated signal 609 up to a necessary value, and outputs transmission modulation signal 611. Directional coupler 612 outputs the most parts of signal 611 as output-transmission modulation signal 613, and distributes the rest as transmission modulation signal 614.

Phase/amplitude control section 615 controls the phase and amplitude of distributed transmission modulation signal 614 such that a desirable signal component of signal 614 has an amplitude equal to that of reference modulation signal 621 created in second orthogonal modulator 620 and has a phase different by 180° from that of signal 621. Then control section 615 outputs controlled signal 616.

Second data delaying section 618 delays transmission digital orthogonal base-band signal 601 by a predetermined amount. Second orthogonal modulator 620 orthogonally modulates digital transmission orthogonal base-band signal 619 delayed by second data delaying section 618, and provides signal 619 with D/A conversion to output reference modulation signal 621.

Directional coupler 617 combines signal 616, whose phase and amplitude are controlled, with reference modulation signal 621, then outputs feedback signal 622. Orthogonal demodulator 623 provides feedback signal 622 with A/D conversion before orthogonally demodulating the signal 622, then outputs feedback digital orthogonal base-band signal 624.

Third data delaying section 626 outputs digital orthogonal base-band signal 627 formed by delaying the signal 601 by a predetermined amount. Digital adder 625 adds signal 627 to feedback digital orthogonal base-band signal 624, and outputs the added feedback digital orthogonal base-band signal 628. First data delaying section 630 delays transmission digital orthogonal base-band signal 601 by a delayed time of the feedback system circuit, and outputs delayed transmission digital orthogonal base-band signal 631.

Computation coefficient updating section 629 updates coefficient 632 of the computing equation, by which compensation coefficient calculator 604 calculates the non-linear distortion compensating data, based on delayed transmission digital orthogonal base-band signal 631 and added feedback digital orthogonal base-band signal 628.

As discussed above, this embodiment shows that the control of a feedback signal, i.e. the distributed transmission modulation signal, such that transmission modulation signal 616 and reference modulation signal 621 have an amplitude equal to each other and a phase difference in 180 degrees from each other. Then coupler 617 removes a known component from reference modulation signal 621. This preparation allows reducing a change amount of an input signal at A/D conversion in the feedback system circuit. As a result, the A/D converter of the feedback system circuit does not necessarily to have a wide dynamic range.

Use of an approximate equation to express non-linear characteristics in this sixth embodiment allows obtaining non-linear distortion compensating data with a little amount of memory, and thereby compensating appropriately distortions created in a transmission system circuit, such as a power amplifier.

Further in this embodiment, since input signal 628 to the reference table updating section includes a component of transmission digital orthogonal base-band signal, no changes are needed in an algorithm used in the reference table updating section of the conventional method. In the conventional method, parts of the transmission signal are fed back as a feedback signal, then the feedback signal is orthogonally demodulated and undergoes A/D conversion to become a digital feedback signal. The conventional method compares this feedback signal with an orthogonal modulation signal to be transmitted.

In the foregoing description, the phase/amplitude control section is disposed to the signal distributed from the transmission modulation signal; however, the control section can be disposed to the reference modulation signal instead.

In the foregoing demonstration, the non-linear distortion compensating data is found by a computing equation; however, the data is not limited to a specific one as long as the data can be found by processing digital signals. For instance, the coefficient can be changed by combining computing equations based on a fixed reference table.

An instantaneous power of the transmission digital orthogonal base-band signal is used as an input for finding the non-linear distortion compensating data; however, the present invention is not limited to this input. For instance, an instantaneous amplitude of the foregoing signal or the square of an instantaneous power of the same signal can be used.

Exemplary Embodiment 7

The transmission device in accordance with the seventh exemplary embodiment of the present invention includes amplitude control section 729, for controlling the amplitude of a transmission digital orthogonal base-band signal, in addition to the transmission device of the fifth embodiment. The seventh embodiment is demonstrated hereinafter, but the descriptions of the same sections as those of the fifth embodiment are omitted, and an operation focused on the different sections from the fifth embodiment are detailed.

Figure 7:
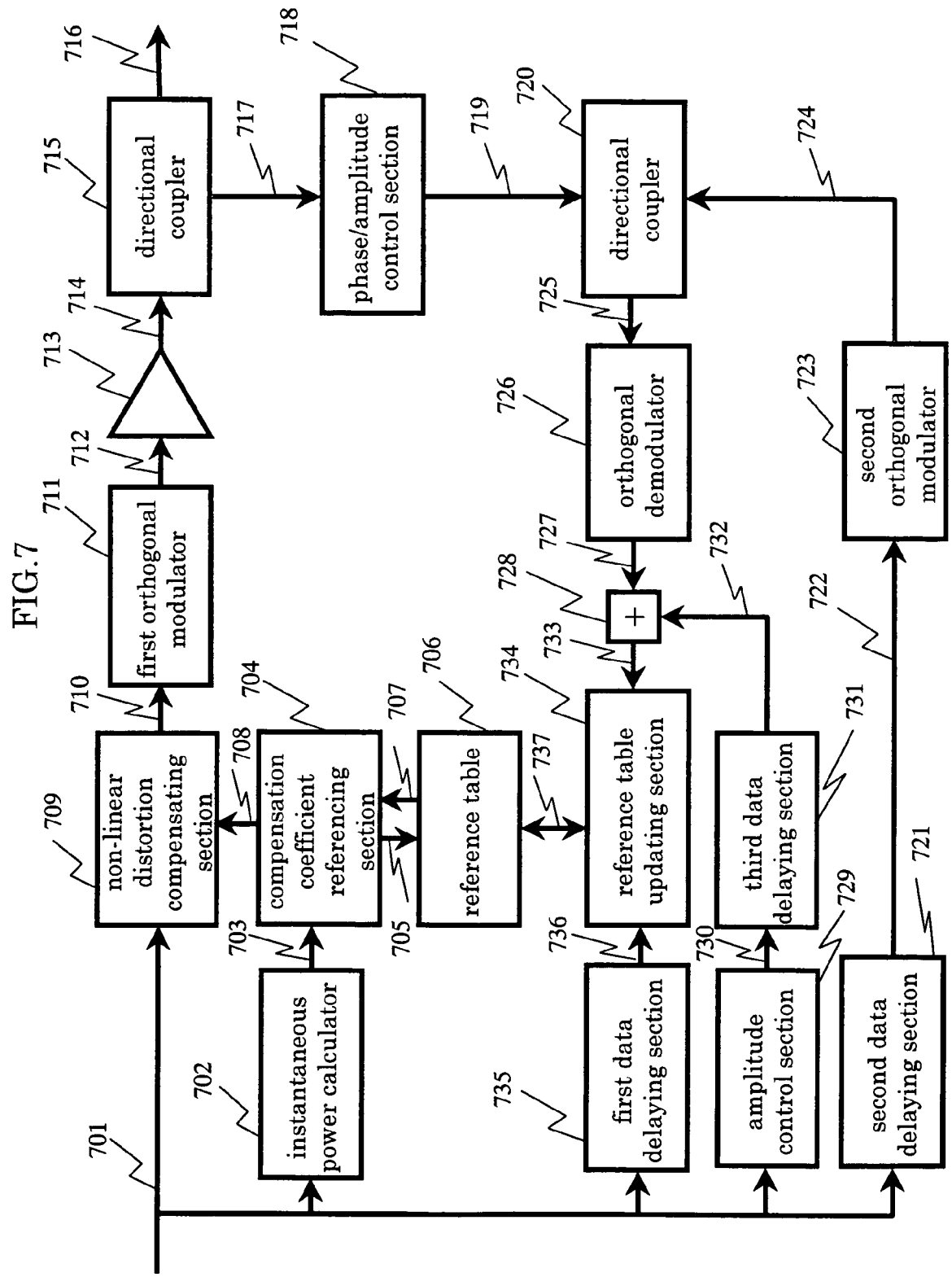
FIG. 7 shows a block diagram illustrating a structure of a transmission device specifically in accordance with a seventh exemplary embodiment of the present invention.

FIG. 7 shows a block diagram illustrating the transmission device in accordance with the seventh embodiment. This transmission device comprises the following elements:
  instantaneous power calculator 702;
  compensation coefficient referencing section 704;
  reference table 706;
  non-linear distortion compensating section 709;
  first orthogonal modulator 711;
  power amplifier 713;
  directional couplers 715;
  phase/amplifier control section 718;
  directional coupler 720;
  second data delaying section 721;
  second orthogonal modulator 723;
  orthogonal demodulator 726;
  digital adder 728;
  amplitude control section 729;
  third data delaying section 731;
  reference table updating section 734; and
  first data delaying section 735.

An operation of the transmission device as structured above is demonstrated hereinafter. Instantaneous power calculator 702 calculates a magnitude of transmission signal 703 based on transmission digital orthogonal base-band signal 701. Compensation coefficient referencing section 704 produces reference address 705 based on the magnitude of transmission signal 703, then refers to reference table 706 to be used for compensating non-linear distortion, thereby obtaining non-linear distortion compensating data 707 having characteristics reversal to the non-linear characteristics of the transmission system for outputting orthogonal non-linear distortion compensating data 708.

Non-linear distortion compensating section 709 produces a complex product of base-band signal 701 and orthogonal non-linear distortion compensating data 708, and outputs orthogonal base-band signal 710 undergone the non-linear distortion compensation. First orthogonal modulator 711 orthogonally modulates compensated base-band signal 710, then provides signal 710 with D/A conversion, and outputs analog modulated signal 712. Power amplifier 713 amplifies analog modulated signal 712 up to a necessary value, and outputs transmission modulation signal 714. Directional coupler 715 outputs the most parts of signal 714 as output-transmission modulation signal 716, and distributes the rest as transmission modulation signal 717.

Phase/amplitude control section 718 controls the phase and amplitude of distributed transmission modulation signal 717 such that a desirable signal component of signal 717 has at least a phase different by 180° from that of reference modulation signal 724 created in second orthogonal modulator 723. Then control section 718 outputs controlled signal 719.

Second data delaying section 721 delays transmission digital orthogonal base-band signal 701 by a predetermined amount. Second orthogonal modulator 723 orthogonally modulates digital transmission orthogonal base-band signal 722 delayed by second data delaying section 721, and provides signal 722 with D/A conversion to produce reference modulation signal 724. Directional coupler 720 combines signal 719, whose phase and amplitude are controlled, with reference modulation signal 724, then outputs feedback signal 725.

Orthogonal demodulator 726 provides feedback signal 725 with A/D conversion before orthogonally demodulating the signal 725, then outputs feedback digital orthogonal base-band signal 727.

Amplitude control section 729 controls an amplitude of transmission digital orthogonal base-band signal 701, and outputs resultant digital orthogonal base-band signal 730. Third data delaying section 731 outputs digital orthogonal base-band signal 732 formed by delaying signal 730 by a predetermined amount.

Digital adder 728 adds signal 732 to feedback digital orthogonal base-band signal 727, and outputs the added feedback digital orthogonal base-band signal 733.

First data delaying section 735 delays transmission digital orthogonal base-band signal 701 by a delayed time of the feedback system circuit, and outputs delayed transmission digital orthogonal base-band signal 736.

Reference table updating section 734 updates reference table 706 with non-linear distortion compensating data 737 based on the delayed transmission digital orthogonal base-band signal 736 and the added feedback digital orthogonal base-band signal 733.

As discussed above, this embodiment shows that the control of a feedback signal, i.e. the distributed transmission modulation signal, such that transmission modulation signal 719 and reference modulation signal 724 have an amplitude equal to each other and a phase difference in 180 degrees from each other. Then coupler 720 removes a known component of reference modulation signal 724. This preparation allows reducing a change amount of an input signal at A/D conversion in the feedback system circuit. As a result, the A/D converter of the feedback system circuit does not necessarily to have a wide dynamic range performance. Use of a reference table in this seventh embodiment allows compensating appropriately distortions created in a transmission system circuit, such as a power amplifier, having non-linear characteristics which is hard to express in a numerical formula.

Further in this embodiment, since the input signal to the reference table updating section includes a component of transmission digital orthogonal base-band signal, no changes are needed in an algorithm used in the reference table updating section of the conventional method. In the conventional method, parts of the transmission signal are fed back as a feedback signal, then the feedback signal is orthogonally demodulated and undergoes A/D conversion to become a digital feedback signal. The conventional method compares this feedback signal with an orthogonal modulation signal to be transmitted.

Further, the amplitude control section is prepared to the third data delaying section, so that a dynamic range of a digital signal to be fed into the reference table updating section can be controlled.

In the foregoing description, the phase/amplitude control section is disposed to the signal distributed from the transmission modulation signal; however, the control section can be disposed to the reference modulation signal instead.

Exemplary Embodiment 8

The transmission device in accordance with the eighth exemplary embodiment of the present invention includes amplitude control section 826, for controlling the amplitude of a transmission digital orthogonal base-band signal, in addition to the transmission device of the sixth embodiment. The eighth embodiment is demonstrated hereinafter, but the descriptions of the same sections as those of the sixth embodiment are omitted, and an operation focused on the different sections from the sixth embodiment are detailed.

Figure 8:
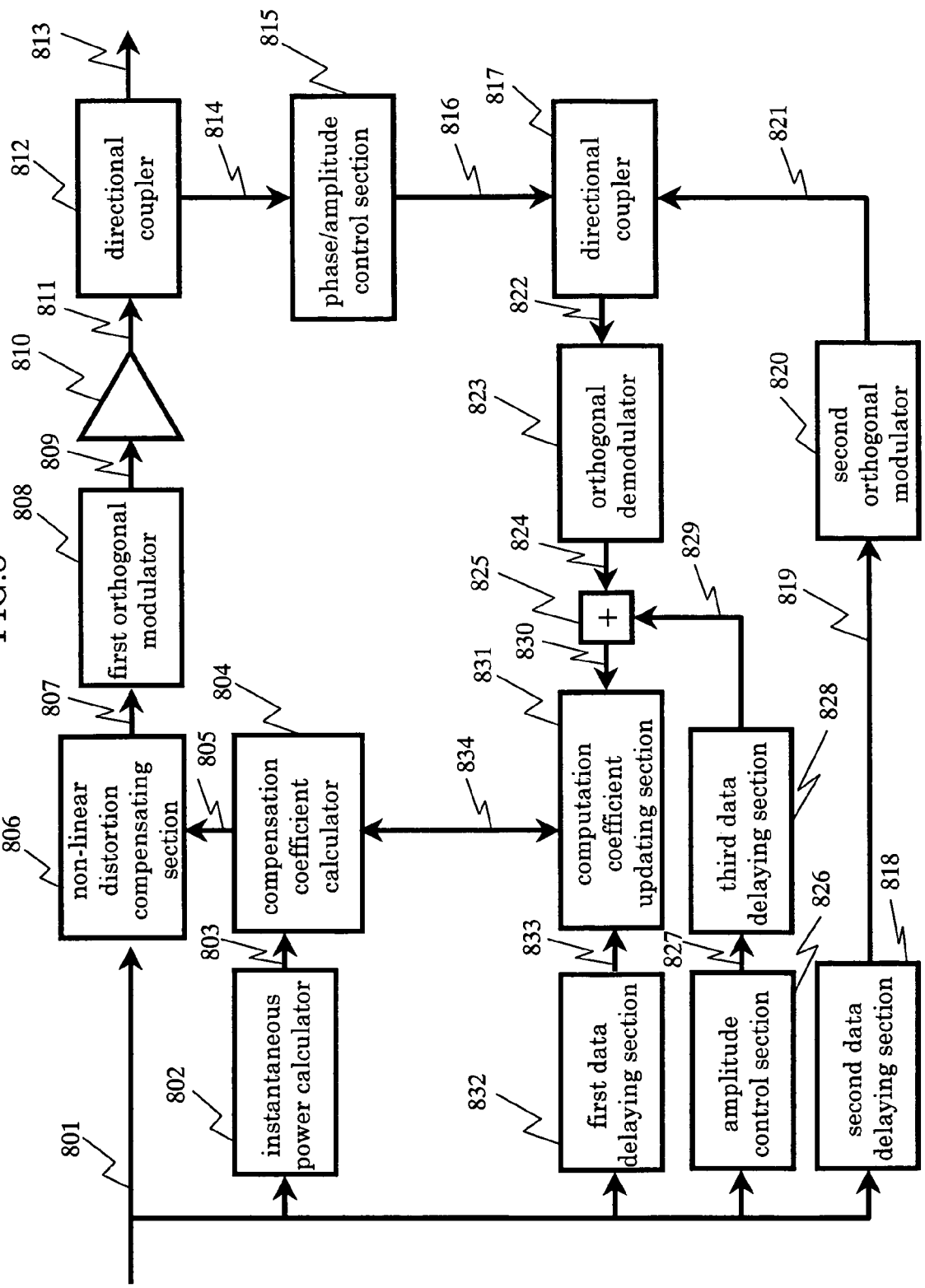
FIG. 8 shows a block diagram illustrating a structure of a transmission device specifically in accordance with an eighth exemplary embodiment of the present invention.

FIG. 8 shows a block diagram illustrating the transmission device in accordance with the eighth embodiment. This transmission device comprises the following elements:
   instantaneous power calculator 802;
   compensation coefficient calculator 804;
   non-linear distortion compensating section 806;
   first orthogonal modulator 808;
   power amplifier 810;
   directional couplers 812;
   phase/amplifier control section 815;
   directional coupler 817;
   second data delaying section 818;
   second orthogonal modulator 820;
   orthogonal demodulator 823;
   digital adder 825;
   amplitude control section 826;
   third data delaying section 828;
   computation coefficient updating section 831; and
   first data delaying section 832.

An operation of the transmission device as structured above is demonstrated hereinafter. Instantaneous power calculator 802 calculates a magnitude of transmission signal 803 based on transmission digital orthogonal base-band signal 801. Compensation coefficient calculator 804 calculates orthogonal non-linear distortion compensating data 805 by a predetermined computing equation based on the magnitude of transmission signal 803.

Non-linear distortion compensating section 806 produces a complex product of transmission digital orthogonal base-band signal 801 and non-linear distortion compensating data 805, and outputs orthogonal base-band signal 807 undergone the non-linear distortion compensation. First orthogonal modulator 808 orthogonally modulates compensated base-band signal 807, then provides signal 807 with D/A conversion, and outputs analog modulated signal 809.

Power amplifier 810 amplifies analog modulated signal 809 up to a necessary value, and outputs transmission modulation signal 811. Directional coupler 812 outputs the most parts of signal 811 as output-transmission modulation signal 813, and distributes the rest as transmission modulation signal 814.

Phase/amplitude control section 815 controls the phase and amplitude of distributed transmission modulation signal 814 such that a desirable signal component of signal 814 has at least a phase different by 180° from that of reference modulation signal 821 created in second orthogonal modulator 820. Then control section 815 outputs signal 816 of which phase and amplitude are controlled.

Second data delaying section 818 delays transmission digital orthogonal base-band signal 801 by a predetermined amount. Second orthogonal modulator 820 orthogonally modulates digital transmission orthogonal base-band signal 819 delayed by second data delaying section 818, and provides signal 819 with D/A conversion to output reference modulation signal 821.

Directional coupler 817 combines signal 816, whose phase and amplitude are controlled, with reference modulation signal 821, then outputs feedback signal 822. Orthogonal demodulator 823 provides feedback signal 822 with A/D conversion before orthogonally demodulating the signal 822, then outputs feedback digital orthogonal base-band signal 824.

Amplitude control section 826 controls an amplitude of transmission digital orthogonal base-band signal 801, and outputs resultant digital orthogonal base-band signal 827.

Third data delaying section 828 outputs digital orthogonal base-band signal 829 formed by delaying signal 827 by a predetermined amount.

Digital adder 825 adds signal 829 to feedback digital orthogonal base-band signal 824, and outputs the added feedback digital orthogonal base-band signal 830.

First data delaying section 830 delays transmission digital orthogonal base-band signal 801 by a delayed time of the feedback system circuit, and outputs delayed transmission digital orthogonal base-band signal 831.

Computation coefficient updating section 831 updates coefficient 834 of the computing equation, by which compensation coefficient calculator 804 calculates the non-linear distortion compensating data, based on delayed transmission digital orthogonal base-band signal 833 and added feedback digital orthogonal base-band signal 830.

As discussed above, this embodiment shows that the control of a feedback signal, i.e. the distributed transmission modulation signal, such that transmission modulation signal 816 and reference modulation signal 821 have an amplitude equal to each other and a phase difference in 180 degrees from each other. Then coupler 817 removes a known component of reference modulation signal 821. This preparation allows reducing a change amount of an input signal at A/D conversion in the feedback system circuit. As a result, the A/D converter of the feedback system circuit does not necessarily to have a wide dynamic range performance.

Use of an approximate equation to express non-linear characteristics in this eighth embodiment allows obtaining non-linear distortion compensating data with a little amount of memory, and thereby compensating appropriately distortions created in a transmission system circuit, such as a power amplifier.

Further in this embodiment, since input signal 830 to the reference table updating section includes a component of transmission digital orthogonal base-band signal, no changes are needed in an algorithm used in the reference table updating section of the conventional method. In the conventional method, parts of the transmission signal are fed back as a feedback signal, then the feedback signal is orthogonally demodulated and undergoes A/D conversion to become a digital feedback signal. The conventional method compares this feedback signal with an orthogonal modulation signal to be transmitted.

Further, the amplitude control section is disposed to the third data delaying section, so that a dynamic range of a digital signal to be fed into the reference table updating section can be controlled.

In the foregoing description, the phase/amplitude control section is disposed to the signal distributed from the transmission modulation signal; however, the control section can be disposed to the reference modulation signal instead.

In the foregoing demonstration, the non-linear distortion compensating data is found by a computing equation; however, the data is not limited to a specific one as long as the data can be found by processing digital signals. For instance, the coefficient can be changed by combining computing equations based on a fixed reference table.

An instantaneous power of the transmission digital orthogonal base-band signal is used as an input for finding the non-linear distortion compensating data; however, the present invention is not limited to this input. For instance, an instantaneous amplitude of the foregoing signal or the square of an instantaneous power of the same signal can be used.

Exemplary Embodiment 9

The transmission device in accordance with the ninth exemplary embodiment of the present invention is equipped with frequency converter 918 for changing a center frequency of a signal to be combined in directional coupler 922. The transmission device in accordance with the ninth embodiment is demonstrated, but the descriptions of the same sections as those of the first embodiment are omitted, and an operation different from that of the first embodiment are focused.

Figure 9:
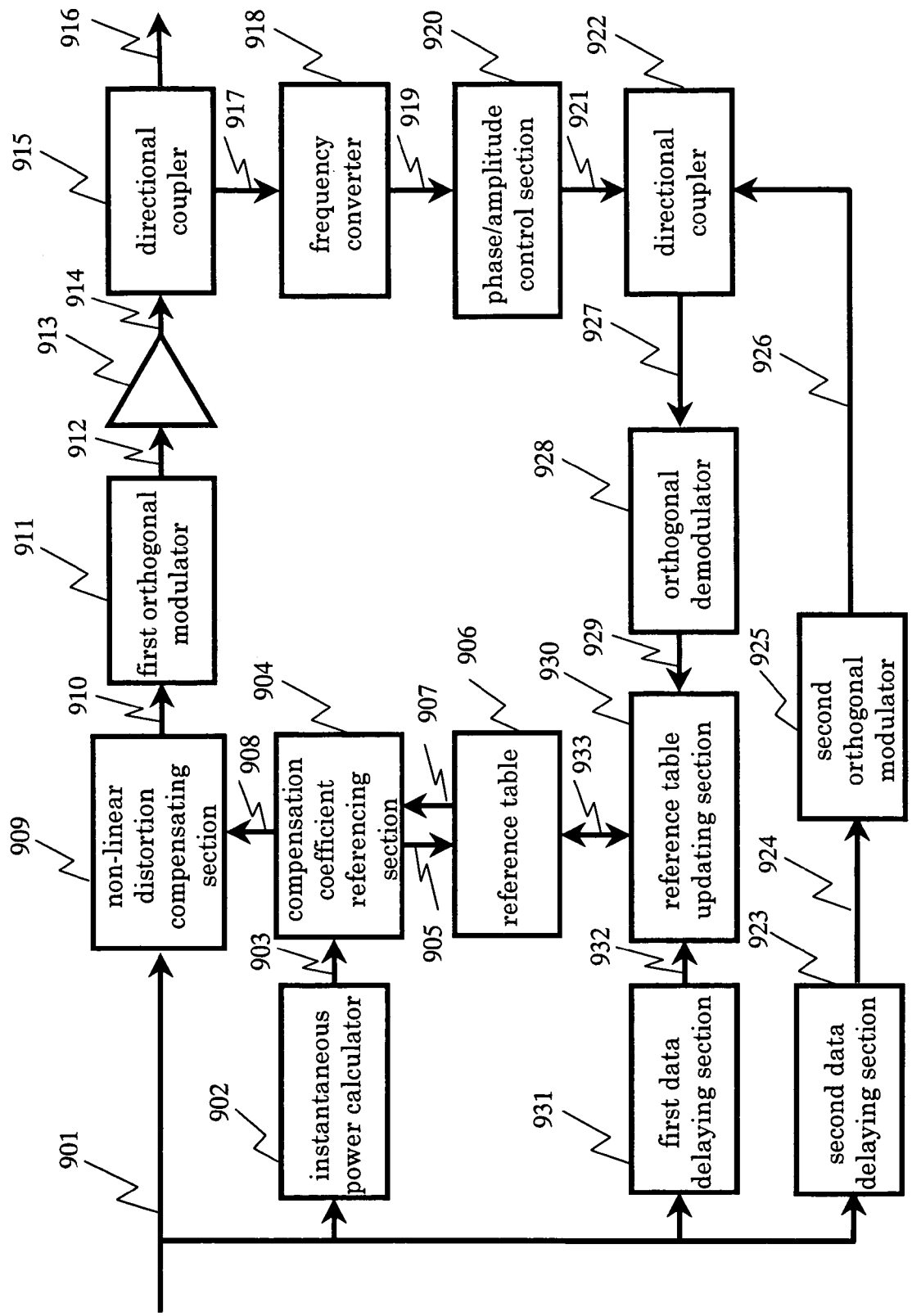
FIG. 9 shows a block diagram illustrating a structure of a transmission device specifically in accordance with a ninth exemplary embodiment of the present invention.

FIG. 9 shows a block diagram illustrating the transmission in accordance with the ninth embodiment. This transmission device comprises the following elements:
instantaneous power calculator 902;
compensation coefficient referencing section 904;
reference table 906;
non-linear distortion compensating section 909;
orthogonal modulator 911;
power amplifier 913;
directional couplers 915;
frequency converter 918;
phase/amplifier control section 920;
directional coupler 922;
second data delaying section 923;
second orthogonal modulator 925;
orthogonal demodulator 928;
reference table updating section 930; and
first data delaying section 931.

An operation of the transmission device as structured above is demonstrated hereinafter. Instantaneous power calculator 902 calculates a magnitude of transmission signal 903 based on transmission digital orthogonal base-band signal 901. Compensation coefficient referencing section 904 produces reference address 905 based on the magnitude of transmission signal 903, then refers to reference table 906 to be used for compensating non-linear distortion, thereby obtaining non-linear distortion compensating data 907 having characteristics reversal to the non-linear characteristics of the transmission system. Then referencing section 904 outputs orthogonal non-linear distortion compensating data 908.

Non-linear distortion compensating section 909 produces a complex product of base-band signal 901 and orthogonal non-linear distortion compensating data 908, and outputs orthogonal base-band signal 910 undergone the non-linear distortion compensation. First orthogonal modulator 911 orthogonally modulates compensated base-band signal 910, then provides signal 710 with D/A conversion, and outputs analog modulated signal 912.

Power amplifier 913 amplifies analog modulated signal 912 up to a necessary value, and outputs transmission modulation signal 914. Directional coupler 915 outputs the most parts of signal 914 as output-transmission modulation signal 916, and distributes the rest as transmission modulation signal 917. Frequency converter 918 converts the frequency of signal 917 before outputting signal 919.

Phase/amplitude control section 920 controls the phase and amplitude of signal 919 supplied from frequency converter 918 such that a desirable signal component of signal 919 has an amplitude equal to that of reference modulation signal 926 created in second orthogonal modulator 925 and has a phase different by 180° from that of signal 926. Then control section 920 outputs signal 921 of which phase and amplitude are controlled.

Second data delaying section 923 delays transmission digital orthogonal base-band signal 901 by a predetermined amount. Second orthogonal modulator 925 orthogonally modulates digital transmission orthogonal base-band signal 924 delayed by second data delaying section 923, and provides signal 924 with D/A conversion to produce reference modulation signal 926. Directional coupler 922 combines signal 921, whose phase and amplitude are controlled, with reference modulation signal 926, then outputs feedback signal 927.

Orthogonal demodulator 928 provides feedback signal 927 with A/D conversion before orthogonally demodulating the signal 927, then outputs feedback digital orthogonal base-band signal 929.

First data delaying section 931 delays transmission digital orthogonal base-band signal 901 by a delayed time of the feedback system circuit, and outputs delayed transmission digital orthogonal base-band signal 932.

Reference table updating section 930 updates reference table 906 with non-linear distortion compensating data 933 based on the delayed transmission digital orthogonal base-band signal 932 and feedback digital orthogonal base-band signal 929.

As discussed above, this embodiment shows that the frequency converter converts the frequency of the feedback signal, thereby steadily removing a known component of the reference modulation signal from the feedback signal that is used for updating the non-linear distortion compensating data. As a result, the A/D converter of the feedback system circuit does not necessarily to have a wide dynamic range.

In this embodiment, the phase/amplitude control section is disposed after the frequency converter; however it can be disposed before the converter, and the control section can be disposed after the second orthogonal modulator.

In this embodiment, a reference table is disposed; however, instead of the reference table, the coefficient of a computing equation can be updated by calculating the non-linear distortion compensating data with the computing equation of the compensation coefficient calculator, as discussed in the second embodiment.

An instantaneous power of the transmission digital orthogonal base-band signal is used as an input for finding the non-linear distortion compensating data; however, the present invention is not limited to this input. For instance, an instantaneous amplitude of the foregoing signal or the square of an instantaneous power of the same signal can be used.

Exemplary Embodiment 10

The transmission device in accordance with the tenth exemplary embodiment of the present invention includes signal combiner 1022 instead of a directional coupler for obtaining a combinatory signal, and combines a signal at a base-band. The transmission device in accordance with the tenth embodiment is demonstrated, but the descriptions of the same sections as those of the first embodiment are omitted, and an operation different from that of the first embodiment are focused.

Figure 10:
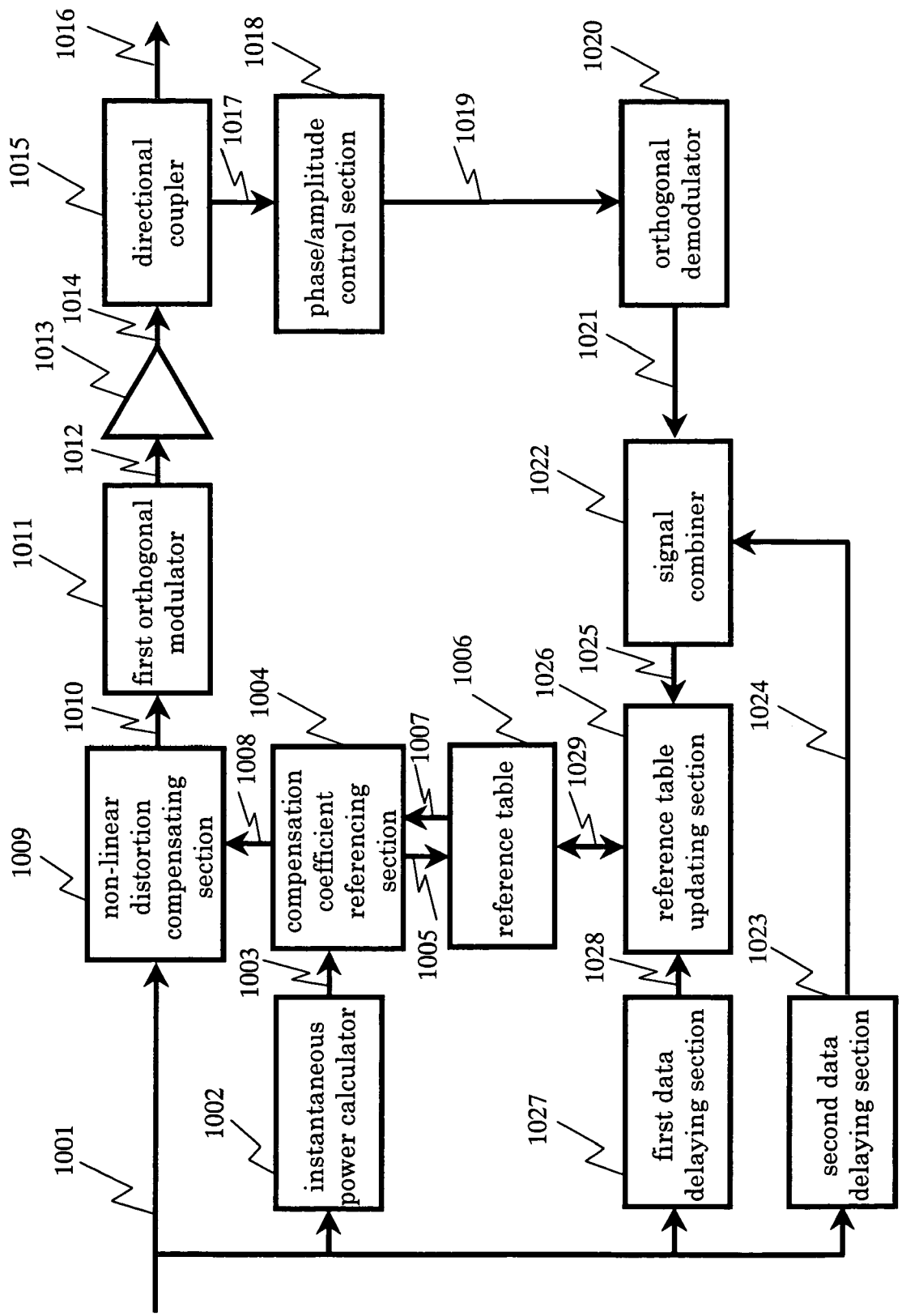
FIG. 10 shows a block diagram illustrating a structure of a transmission device specifically in accordance with a tenth exemplary embodiment of the present invention.

FIG. 10 shows a block diagram illustrating the transmission in accordance with the tenth embodiment. This transmission device comprises the following elements:

instantaneous power calculator 1002;
compensation coefficient referencing section 1004;
reference table 1006;
non-linear distortion compensating section 1009;
orthogonal modulator 1011;
power amplifier 1013;
directional couplers 1015;
phase/amplifier control section 1018;
orthogonal demodulator 1020;
signal combiner 1022;
second data delaying section 1023;
reference table updating section 1026; and
first data delaying section 1027.

An operation of the transmission device as structured above is demonstrated hereinafter. Instantaneous power calculator 1002 calculates a magnitude of transmission signal 1003 based on transmission digital orthogonal base-band signal 1001. Compensation coefficient referencing section 1004 produces reference address 1005 based on the magnitude of transmission signal 1003, then refers to reference table 1006 to be used for compensating non-linear distortion, thereby obtaining non-linear distortion compensating data 1007 having characteristics reversal to the non-linear characteristics of the transmission system for outputting orthogonal non-linear distortion compensating data 1008.

Non-linear distortion compensating section 1009 produces a complex product of base-band signal 1001 and orthogonal non-linear distortion compensating data 1008, and outputs orthogonal base-band signal 1010 undergone the non-linear distortion compensation. First orthogonal modulator 1011 orthogonally modulates compensated base-band signal 1010, then provides signal 1010 with D/A conversion, and outputs analog modulated signal 1012.

Power amplifier 1013 amplifies analog modulated signal 1012 up to a necessary value, and outputs transmission modulation signal 1014. Directional coupler 1015 outputs the most parts of signal 1014 as output-transmission modulation signal 1016, and distributes the rest as transmission modulation signal 1017.

Phase/amplitude control section 1018 controls the phase and amplitude of signal 1017 such a desirable signal component of signal 1017 has an amplitude equal to that of distributed reference base-band signal 1024, which is described later, and has a phase different by 180° from that of signal 1024. Then control section 1018 outputs signal 1019 of which phase and amplitude are controlled. Orthogonal demodulator 1020 orthogonally demodulates signal 1019 and outputs orthogonal base-band signal 1021.

Second data delaying section 1023 delays transmission digital orthogonal base-band signal 1001 by a predetermined amount, then provides signal 1001 with D/A conversion, and outputs delayed reference base-band signal 1024. Signal combiner 1022 combines orthogonal base-band signal 1021 and reference base-band signal 1024, and provides the resultant signal with A/D conversion, so that feedback digital orthogonal base-band signal 1025 is obtainable.

First data delaying section 1027 delays transmission digital orthogonal base-band signal 1001 by a delayed time of the feedback system circuit, and outputs delayed transmission digital orthogonal base-band signal 1028.

Reference table updating section 1026 updates reference table 1006 with non-linear distortion compensating data 1029 based on the delayed transmission digital orthogonal base-band signal 1028 and feedback digital orthogonal base-band signal 1025.

As discussed above, this embodiment shows that a known component of the reference modulation signal can be removed at a base-band from the feedback signal that is used for updating the non-linear distortion compensating data. As a result, the A/D converter of the feedback system circuit does not necessarily to have a wide dynamic range performance.

In this embodiment, the phase/amplitude control section is disposed to a signal distributed from the transmission modulation signal; however, the control section can be disposed to the reference base-band signal instead.

In this embodiment, a reference table is disposed; however, instead of the reference table, the coefficient of a computing equation can be updated by calculating the non-linear distortion compensating data with the computing equation of the compensation coefficient calculator, as discussed in the second embodiment.

An instantaneous power of the transmission digital orthogonal base-band signal is used as an input for finding the non-linear distortion compensating data; however, the present invention is not limited to this input. For instance, an instantaneous amplitude of the foregoing signal or the square of an instantaneous power of the same signal can be used.

In the embodiments 1-9, orthogonal demodulator 126, 223, 326, 423, 526, 623, 726, 823, and 928 are demonstrated after A/D conversion; however, the A/D conversion can be carried out after the orthogonal demodulation. The first orthogonal modulator in every embodiment is carried out before D/A conversion; however, the D/A conversion can be carried out before the orthogonal modulation.

INDUSTRIAL APPLICABILITY

The transmission device of the present invention includes non-linear distortion compensating function which allows the A/D converter of the feedback system circuit not necessarily to have a wide dynamic range performance. This transmission device can be used in communication apparatuses of radio communication systems which adopt a digital modulation method, and is useful for compensating non-linear distortions created in an amplifier of the transmission system.

The invention claimed is:

1. A transmission device comprising:
   a non-linear distortion compensating section for compensating non-linear distortion of an orthogonal base-band signal that is digitally modulated to form a distortion compensated signal by using non-linear distortion compensating data;
   a first orthogonal modulator for orthogonally modulating the distortion compensated signal received from the non-linear distortion compensating section;
   a modulation signal distributor for distributing a feedback signal formed by amplifying the distortion compensated signal orthogonally modulated by the first orthogonal modulator;
   a phase/amplitude control section for controlling a phase and an amplitude of at least one of 1) the feedback signal distributed by the modulation signal distributor and 2) a reference signal based on the input orthogonal base-band signal;
   a signal combiner for generating a combinatory signal based on the feedback signal and the reference signal, at least one of the feedback signal and the reference signal that are provided to the signal combiner being phase and amplitude controlled by the phase/amplitude control section; and
   an updating section for updating the non-linear distortion compensating data based on the input orthogonal base-band signal and the combinatory signal provided by the signal combiner, the combinatory signal being analog-digital converted prior to being received by the updating section,
   wherein the phase/amplitude control section controls the phase and the amplitude of the feedback signal, and the reference signal is generated by a second orthogonal modulator by orthogonally modulating the input orthogonal base-band signal,
   wherein the updating section updates the non-linear distortion compensating data by using the input orthogonal base-band signal and a demodulated signal obtained by an orthogonal demodulator which one of 1) orthogonally demodulates the analog-digital converted combinatory signal and 2) provides the combinatory signal with analog-digital conversion and orthogonally demodulates the combinatory signal.

2. The transmission device of claim 1, wherein at least one of the feedback signal supplied to the phase/amplitude control section from the modulation signal distributor and the reference signal supplied to the signal combiner from the second orthogonal modulator is provided with a frequency conversion.

3. The transmission device of claim 2 further comprising a reference table for storing the non-linear distortion compensating data.

4. The transmission device of claim 2, wherein the updating section includes a compensation coefficient calculator for calculating the non-linear distortion compensating data with a computing equation and a computing coefficient updating section for updating a coefficient of the computing equation.

5. The transmission device of claim 1 further comprising a reference table for storing the non-linear distortion compensating data.

6. The transmission device of claim 1, wherein the updating section includes a compensation coefficient calculator for calculating the non-linear distortion compensating data with a computing equation and a computing coefficient updating section for updating a coefficient of the computing equation.

7. A transmission device comprising:
   a non-linear distortion compensating section for compensating non-linear distortion of an orthogonal base-band signal that is digitally modulated to form a distortion compensated signal by using non-linear distortion compensating data;
   a first orthogonal modulator for orthogonally modulating the distortion compensated signal received from the non-linear distortion compensating section;
   a modulation signal distributor for distributing a feedback signal formed by amplifying the distortion compensated signal orthogonally modulated by the first orthogonal modulator;
   a phase/amplitude control section for controlling a phase and an amplitude of at least one of 1) the feedback signal distributed by the modulation signal distributor and 2) a reference signal based on the input orthogonal base-band signal;
   a signal combiner for generating a combinatory signal based on the feedback signal and the reference signal, at least one of the feedback signal and the reference signal that are provided to the signal combiner being phase and amplitude controlled by the phase/amplitude control section; and
   an updating section for updating the non-linear distortion compensating data based on the input orthogonal base-band signal and the combinatory signal provided by the signal combiner, the combinatory signal being analog-digital converted prior to being received by the updating section, wherein the reference signal is generated by a second orthogonal modulator by input orthogonally modulating the orthogonal base-band signal, wherein the phase/amplitude control section controls the phase and the amplitude of the reference signal provided from the second orthogonal modulator;

wherein the updating section updates the non-linear distortion compensating data by using the input orthogonal base-band signal and a demodulated signal obtained by an orthogonal demodulator which one of 1) orthogonally demodulates the analog-digital converted combinatory signal and 2) provides the combinatory signal with analog-digital conversion and orthogonally demodulates the combinatory signal.

8. The transmission device of claim 7, wherein at least one of the feedback signal supplied to the phase/amplitude control section from the modulation signal distributor, a phase and amplitude controlled signal supplied from the phase/amplitude control section to the signal combiner, and the reference signal supplied from the second orthogonal modulator to the signal combiner is provided with a frequency conversion.

9. The transmission device of claim 8 further comprising a reference table for storing the non-linear distortion compensating data.

10. The transmission device of claim 8, wherein the updating section includes a compensation coefficient calculator for calculating the non-linear distortion compensating data with a computing equation and a computing coefficient updating section for updating a coefficient of the computing equation.

11. The transmission device of claim 7 further comprising a reference table for storing the non-linear distortion compensating data.

12. The transmission device of claim 7, wherein the updating section includes a compensation coefficient calculator for calculating the non-linear distortion compensating data with a computing equation and a computing coefficient updating section for updating a coefficient of the computing equation.

13. A transmission device comprising:
a non-linear distortion compensating section for compensating non-linear distortion of an orthogonal base-band signal that is digitally modulated to form a distortion compensated signal by using non-linear distortion compensating data;
a first orthogonal modulator for orthogonally modulating the distortion compensated signal received from the non-linear distortion compensating section;
a modulation signal distributor for distributing a feedback signal formed by amplifying the distortion compensated signal orthogonally modulated by the first orthogonal modulator;
a phase/amplitude control section for controlling a phase and an amplitude of at least one of 1) the feedback signal distributed by the modulation signal distributor and 2) a reference signal based on the input orthogonal base-band signal;
a signal combiner for generating a combinatory signal based on the feedback signal and the reference signal, at least one of the feedback signal and the reference signal that are provided to the signal combiner being phase and amplitude controlled by the phase/amplitude control section; and
an updating section for updating the non-linear distortion compensating data based on the input orthogonal base-band signal and the combinatory signal provided by the signal combiner, the combinatory signal being analog-digital converted prior to being received by the updating section;
an orthogonal demodulator for one of 1) orthogonally demodulating the analog-digital converted combinatory signal and 2) providing the combinatory signal with analog-digital conversion and orthogonally demodulating the combinatory signal; and
an adding circuit for adding the input orthogonal base-band signal and the demodulated signal supplied from the orthogonal demodulator,
wherein the updating section updates the non-linear distortion compensating data by using an output from the adding circuit and the orthogonal base-band signal.

14. The transmission device of claim 13, wherein an amplitude of the input orthogonal base-band signal being added to the adding circuit is controlled.

15. The transmission device of claim 1, further comprising a reference table for storing the non-linear distortion compensating data,
wherein the updating section includes a reference table updating section for updating the reference table.

16. The transmission device of claim 7, further comprising a reference table for storing the non-linear distortion compensating data, wherein the updating section includes a reference table updating section for updating the reference table.

17. The transmission device of claim 13, further comprising a reference table for storing the non-linear distortion compensating data, wherein the updating section includes a reference table updating section for updating the reference table.

* * * * *